United States Patent
Wang et al.

(10) Patent No.: US 8,054,678 B2
(45) Date of Patent: Nov. 8, 2011

(54) STUCK-AT DEFECT CONDITION REPAIR FOR A NON-VOLATILE MEMORY CELL

(75) Inventors: Alan Xuguang Wang, Eden Prairie, MN (US); Xiaobin Wang, Chanhassen, MN (US); Dimitar V. Dimitrov, Edina, MN (US); Hai Li, Eden Prairie, MN (US); Haiwen Xi, San Jose, CA (US); Harry Hongyue Liu, Maple Grove, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 12/900,303

(22) Filed: Oct. 7, 2010

(65) Prior Publication Data

US 2011/0019466 A1 Jan. 27, 2011

Related U.S. Application Data

(63) Continuation of application No. 12/405,918, filed on Mar. 17, 2009, now Pat. No. 7,894,250.

(51) Int. Cl.
*G11C 11/00* (2006.01)

(52) U.S. Cl. ........ 365/158; 365/163; 365/171; 365/173; 365/161; 365/200; 365/201

(58) Field of Classification Search .................. 365/130, 365/131, 158, 161, 163, 171, 173, 200, 201
See application file for complete search history.

(56) References Cited

U.S. PATENT DOCUMENTS

| | | | |
|---|---|---|---|
| 6,408,401 B1 | 6/2002 | Bhavsar et al. | |
| 6,687,862 B1 | 2/2004 | Martinez | |
| 6,839,275 B2 * | 1/2005 | Van Brocklin et al. | 365/173 |
| 7,149,949 B2 | 12/2006 | Jedwab et al. | |
| 7,184,310 B2 | 2/2007 | Vorraro et al. | |
| 7,224,601 B2 * | 5/2007 | Panchula | 365/158 |
| 7,894,250 B2 * | 2/2011 | Wang et al. | 365/158 |
| 2006/0245242 A1 | 11/2006 | Rizzo et al. | |
| 2007/0159898 A1 | 7/2007 | Lamorey et al. | |
| 2007/0171736 A1 | 7/2007 | Nowak et al. | |

FOREIGN PATENT DOCUMENTS

GB 2408603 A 6/2005

* cited by examiner

*Primary Examiner* — Huan Hoang
*Assistant Examiner* — Kretelia Graham
(74) *Attorney, Agent, or Firm* — Fellers, Snider, et al.

(57) ABSTRACT

A method and apparatus for repairing a stuck-at defect condition in a non-volatile memory cell, such as a spin-torque transfer random access memory (STRAM). In some embodiments, a resistive sense element has a magnetic tunneling junction (MTJ) and a repair plane located adjacent to the resistive sense element. The repair plane injects a magnetic field in the MTJ to repair a stuck-at defect condition.

20 Claims, 7 Drawing Sheets

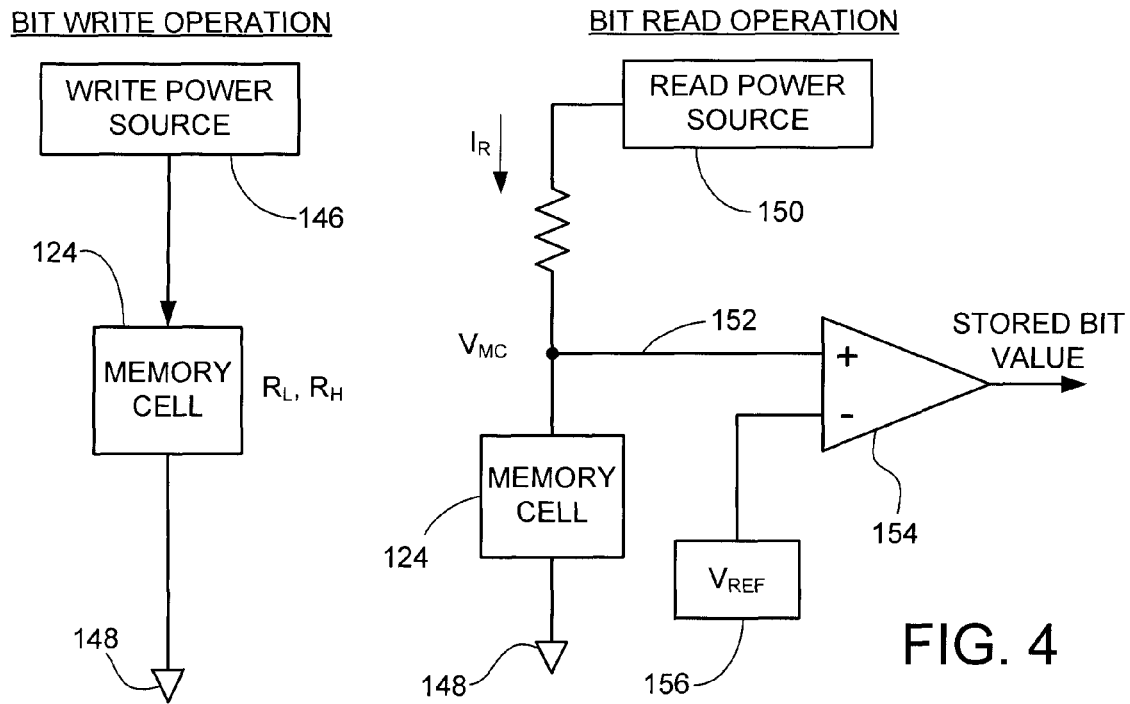
FIG. 3
FIG. 4
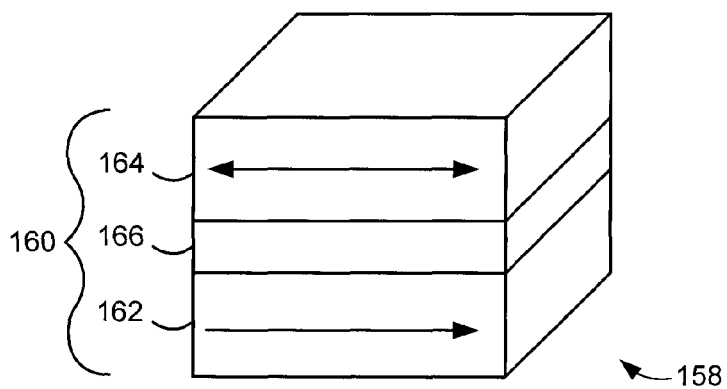
FIG. 5

STUCK-AT DEFECT CONDITION REPAIR FOR A NON-VOLATILE MEMORY CELL

BACKGROUND

Data storage devices generally operate to store and retrieve data in a fast and efficient manner. Some storage devices utilize a semiconductor array of solid-state memory cells to store individual bits of data. Such memory cells can be volatile (e.g., DRAM, SRAM) or non-volatile (RRAM, STRAM, flash, etc.).

As will be appreciated, volatile memory cells generally retain data stored in memory only so long as operational power continues to be supplied to the device, while non-volatile memory cells generally retain data storage in memory even in the absence of the application of operational power.

In these and other types of data storage devices, it is often desirable to increase efficiency of memory cell operation, particularly by improving the yield of a defective memory cell.

SUMMARY

Various embodiments of the present invention are directed to a method and apparatus for repairing a stuck-at defect condition in a non-volatile memory cell, such as but not limited to a STRAM memory cell.

In accordance with various embodiments, a resistive sense element has a magnetic tunneling junction (MTJ) and a repair plane located adjacent to the resistive sense element. The repair plane injects a magnetic field in the MTJ to repair a stuck-at defect condition.

In other embodiments, a resistive sense element having a magnetic tunneling junction (MTJ) and a repair plane is provided. A stuck-at defect condition is repaired by injecting a magnetic field in the MTJ with a repair plane located adjacent to the resistive sense element.

These and various other features and advantages which characterize the various embodiments of the present invention can be understood in view of the following detailed discussion and the accompanying drawings.

BRIEF DESCRIPTION OF THE DRAWINGS

FIG. 3 displays a manner in which data can be written to a memory cell of the memory array.

FIG. 4 illustrates a manner in which data can be read from the memory cell of FIG. 3.

FIG. 5 shows a non-volatile resistive sense element in accordance with various embodiments of the present invention.

DETAILED DESCRIPTION

Figure 1:
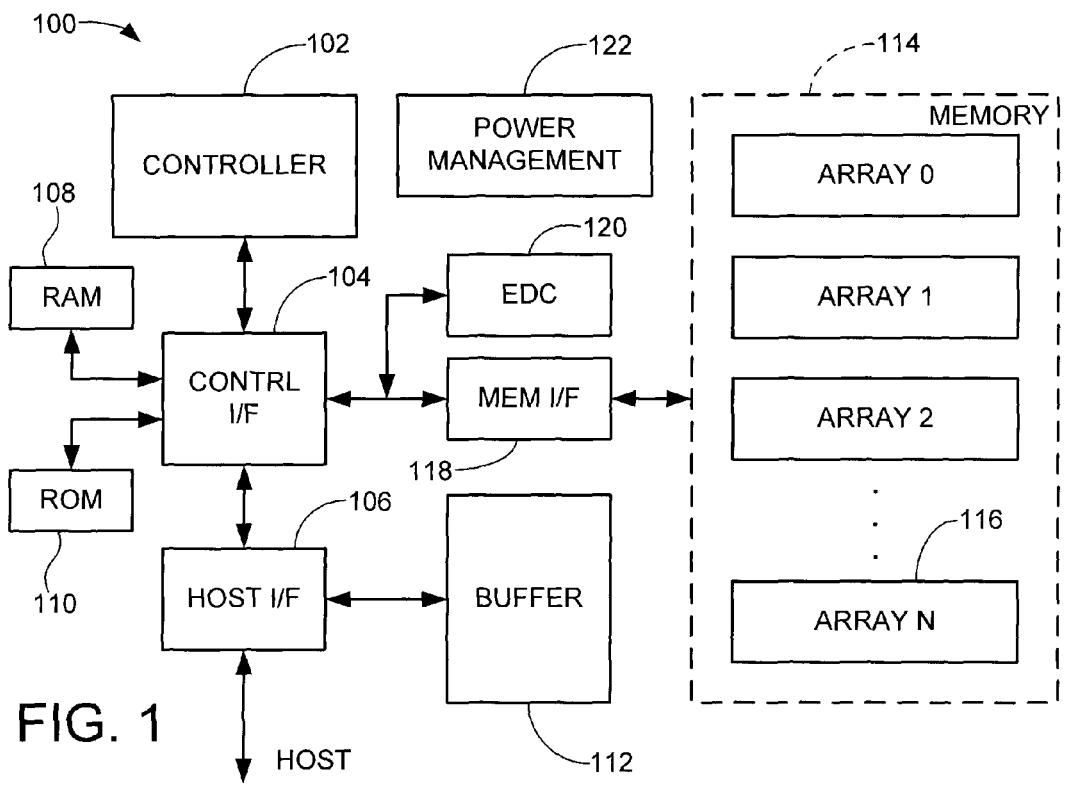
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention. The data storage device is contemplated as comprising a portable non-volatile memory storage device such as a PCMCIA card or USB-style external memory device. It will be appreciated, however, that such characterization of the device 100 is merely for purposes of illustrating a particular embodiment and is not limiting to the claimed subject matter.

Top level control of the device 100 is carried out by a suitable controller 102, which may be a programmable or hardware based microcontroller. The controller 102 communicates with a host device via a controller interface (I/F) circuit 104 and a host I/F circuit 106. Local storage of requisite commands, programming, operational data, etc. is provided via random access memory (RAM) 108 and read-only memory (ROM) 110. A buffer 112 serves to temporarily store input write data from the host device and readback data pending transfer to the host device.

A memory space is shown at 114 to comprise a number of memory arrays 116 (denoted Array 0-N), although it will be appreciated that a single array can be utilized as desired. Each array 116 comprises a block of semiconductor memory of selected storage capacity. Communications between the controller 102 and the memory space 114 are coordinated via a memory (MEM) I/F 118. As desired, on-the-fly error detection and correction (EDC) encoding and decoding operations are carried out during data transfers by way of an EDC block 120.

While not limiting, in some embodiments the various circuits depicted in FIG. 1 are arranged as a single chip set formed on one or more semiconductor dies with suitable encapsulation, housing and interconnection features (not separately shown for purposes of clarity). Input power to operate the device is handled by a suitable power management circuit 122 and is supplied from a suitable source such as from a battery, AC power input, etc. Power can also be supplied to the device 100 directly from the host such as through the use of a USB-style interface, etc.

Any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved.

Figure 2:
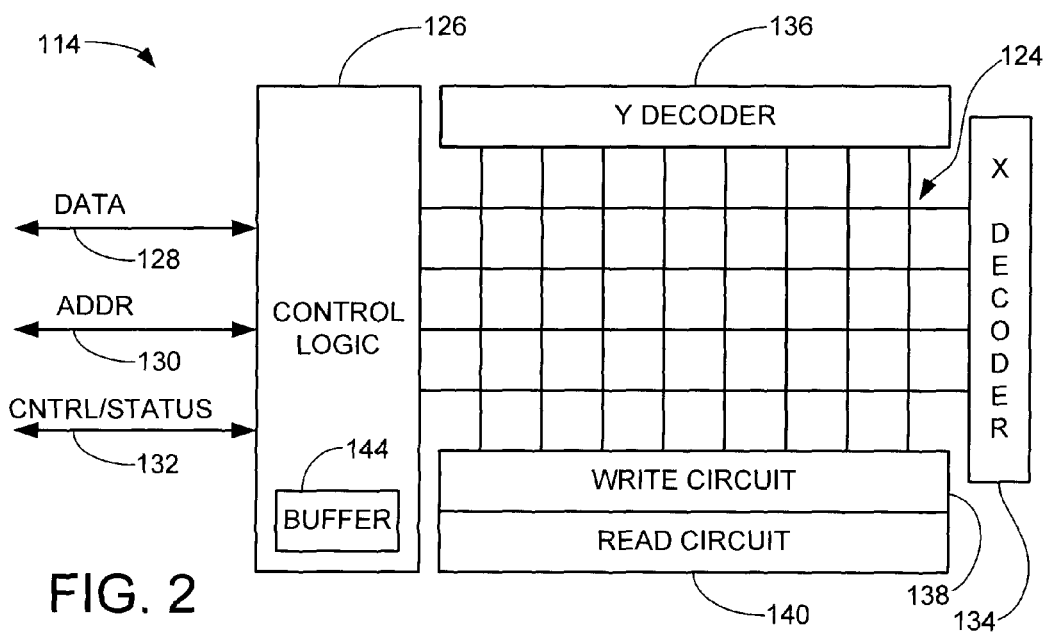
FIG. 2 shows circuitry used to read data from and write data to a memory array of the device of FIG. 1.

FIG. 2 provides a generalized representation of selected aspects of the memory space 114 of FIG. 1. Data are stored as an arrangement of rows and columns of memory cells 124, accessible by various row (word) and column (bit) lines. In some embodiments, each of the array memory cells 124 has magnetic random access memory (MRAM) configuration, such as a spin-torque transfer random access memory (STTRAM or STRAM) configuration.

The actual configurations of the cells and the access lines thereto will depend on the requirements of a given application. Generally, however, it will be appreciated that the various control lines will generally include enable lines that selectively enable and disable the respective writing and reading of the value(s) of the individual cells.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. At this point it will be appreciated that the circuitry of FIG. 2 is merely exemplary in nature, and any number of alternative configurations can readily be employed as desired depending on the requirements of a given application.

Data are written to the respective memory cells 124 as generally depicted in FIG. 3. Generally, a write power source 146 applies the necessary input (such as in the form of current, voltage, magnetization, etc.) to configure the memory cell 124 to a desired state. It can be appreciated that FIG. 3 is merely a representative illustration of a bit write operation. The configuration of the write power source 146, memory cell 124, and reference node 148 can be suitably manipulated to allow writing of a selected logic state to each cell.

As explained below, in some embodiments the memory cell 124 takes a modified STRAM configuration, in which case the write power source 146 is characterized as a current driver connected through a memory cell 124 to a suitable reference node 148, such as ground. The write power source 146 provides a stream of power that is spin polarized by moving through a magnetic material in the memory cell 124. The resulting rotation of the polarized spins creates a torque that changes the magnetic moment of the memory cell 124.

Depending on the magnetic moment, the cell 124 may take either a relatively low resistance ($R_L$) or a relatively high resistance ($R_H$). While not limiting, exemplary $R_L$ values may be in the range of about 100 ohms ($\Omega$) or so, whereas exemplary $R_H$ values may be in the range of about 100K$\Omega$ or so Other resistive memory type configurations (e.g., RRAMs) are supplied with a suitable voltage or other input to similarly provide respective $R_L$ and $R_H$ values. These values are retained by the respective cells until such time that the state is changed by a subsequent write operation. While not limiting, in the present example it is contemplated that a high resistance value ($R_H$) denotes storage of a logical 1 by the cell 124, and a low resistance value ($R_L$) denotes storage of a logical 0.

The logical bit value(s) stored by each cell 124 can be determined in a manner such as illustrated by FIG. 4. A read power source 150 applies an appropriate input (e.g., a selected read voltage) to the memory cell 124. The amount of read current $I_R$ that flows through the cell 124 will be a function of the resistance of the cell ($R_L$ or $R_H$, respectively). The voltage drop across the memory cell (voltage $V_{MC}$) is sensed via path 152 by the positive (+) input of a comparator 154. A suitable reference (such as voltage reference $V_{REF}$) is supplied to the negative (−) input of the comparator 154 from a reference source 156.

The voltage reference $V_{REF}$ can be selected from various embodiments such that the voltage drop $V_{MC}$ across the memory cell 124 will be lower than the $V_{REF}$ value when the resistance of the cell is set to $R_L$, and will be higher than the $V_{REF}$ value when the resistance of the cell is set to $R_H$. In this way, the output voltage level of the comparator 154 will indicate the logical bit value (0 or 1) stored by the memory cell 124.

FIG. 5 shows an exemplary memory cell construction of the device 100 of FIG. 1, characterized as a resistive sense element 158 with a magnetic tunneling junction (MTJ) 160. The MTJ 160 has a fixed magnetic layer 162 and a free magnetic layer 164 adjacent an antiferromagnetic layer 166. In some embodiments, the fixed magnetic layer 162 comprises spin polarizing material that orients the spin of current passing through the resistive sense element 158.

A first resistive state for the element 158, such as the low resistance state, is achieved when the magnetization of the free magnetic layer 164 is oriented to be in the same direction (parallel) as the magnetization of the fixed magnetic layer 162. A second resistive state for the element 158, such as the high resistance state, is achieved when the magnetization of the free magnetic layer 164 is oriented to be opposite (anti-parallel) with the magnetization of the fixed magnetic layer 162. While the magnetization directions are shown to be substantially horizontal with respect to the orientation of FIG. 5, it will be appreciated that other planes of magnetization, including substantially perpendicular orientations, can readily be utilized as desired.

It is contemplated that relatively small magnitude and relatively short duration current pulses will normally be sufficient to switch the cell from either initial resistive state to either final resistive state (i.e., from low to high or from high to low). However, due to a number of factors including manufacturing variations, interference from adjacent cells, externally supplied electrical noise, etc., a so-called stuck-at defect condition may arise.

Generally, as used herein a stuck-at defect condition occurs when the element 158 remains "stuck" at a given resistive state (either high or low resistance), so that the application of programming currents fails to successfully toggle the element 158 to the other state.

While a stuck-at defect condition may be manifested in a number of ways depending on the construction of the element, in some cases a stuck-at defect condition can arise when the magnetization direction of the free layer 164 is set in a non-standard direction, such as being out of plane with the magnetization direction of the fixed layer 162. In such case, a spin polarizing current applied to the element 158 may be unable to switch the magnetization direction of the fixed layer 162 back to the desired direction.

Figure 6:
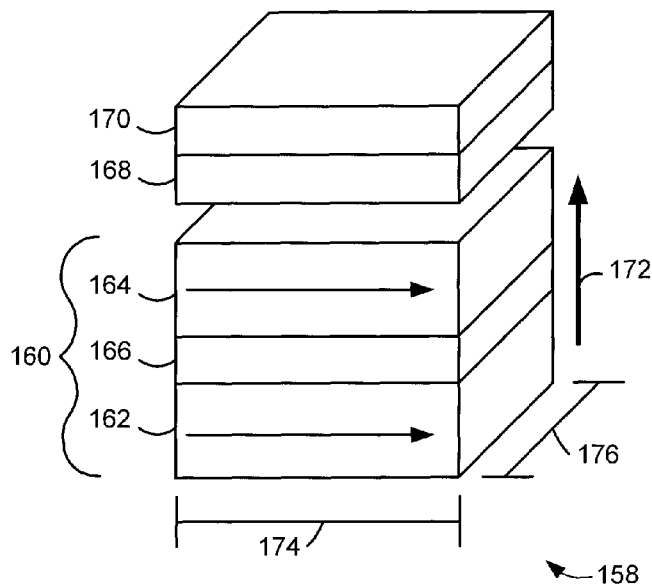
FIG. 6 displays a non-volatile resistive sense element in accordance with various embodiments of the present invention.

Accordingly, various embodiments further configure the element 158 to enable a repair operation to rectify such stuck-at defect conditions. As shown in FIG. 6, the element 158 further includes a conductive repair plane 168 positioned adjacent to the MTJ 160. The repair plane 168 is coupled to an enhancement layer 170 formed of a soft magnetic material. The enhancement layer 170 can additionally include a magnetically insulative material to shield external components from the repair plane.

The repair plane 168 and enhancement layer 170 each have a width 174 and length 176 that match the dimensions of the resistive sense element 158 and provide both active and passive operational modes to reduce stuck-at defect conditions in the element 158. As explained below, when a stuck-at defect condition is detected, one or more suitable current pulses can be actively applied to the repair plane 168. These pulses generate magnetic fields via the enhancement layer 170 to remove the free layer 162 from the stuck-at defect condition.

Further, the repair plane 168 and the enhancement layer 170 passively shield the free layer 162 from stray magnetic fields from external components, thereby reducing the incidence of such stuck-at defect conditions. The repair plane 168 and enhancement layer 170 can further reduce the current magnitude required to generate a magnetic field. It should be noted that the position of the repair plane 168 can be related to the amount of current and corresponding magnetic field required to repair a stuck-at defect condition in the MTJ 160.

Figure 7:
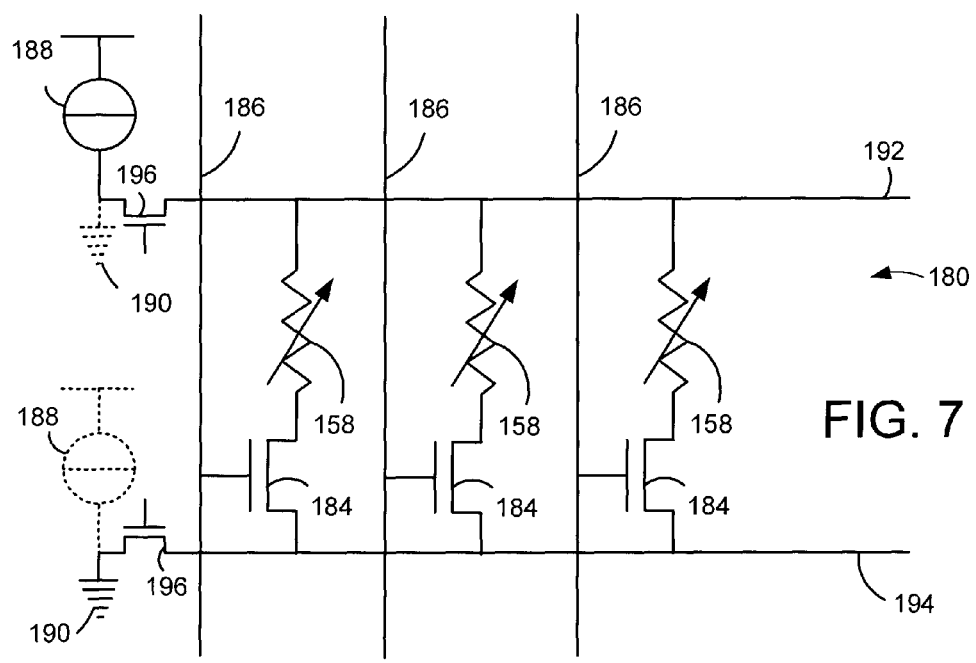
FIG. 7 provides an array of resistive sense elements configured in accordance with various embodiments of the present invention.

FIG. 7 shows a memory array 180 operated in accordance with various embodiments of the present invention. It can be appreciated by a skilled artisan that the memory array 180 can be implemented in various devices, such as the memory devices shown in FIG. 1. A plurality of resistive sense elements 158 are each connected to a switching device 184 that is selectable through a word line 186. Among the various configurations of the memory array 180 is the connection of a source 188 and ground 190 to either the bit line 192 or source line 194 to create a current pathway through the array 180 and resistive sense elements 158 selected by the word lines 186.

A line switching device 196 is connected to a bit line 192 and source line 194 to allow for the manipulation of signals through the bit line 190 and resistive sense elements 158. In some embodiments, a test pattern comprises a signal sent from a source 188 and flows through selected resistive sense elements 158 and switching devices 184 in route to a ground 190 located on the opposing parallel line (either bit line 192 or source line 194).

Each resistive sense element 158 and corresponding switching device 184 forms a unit cell that allows a resistance state and a corresponding logical state to be written to the resistive sense element 158. The writing of a logic state with a write current 172 creates a voltage differential between the bit line 192 and the source line 194. It can be appreciated by one skilled in the art that numerous memory array 180 configurations are possible with manipulation of the bit line 192 drivers.

Figure 8:
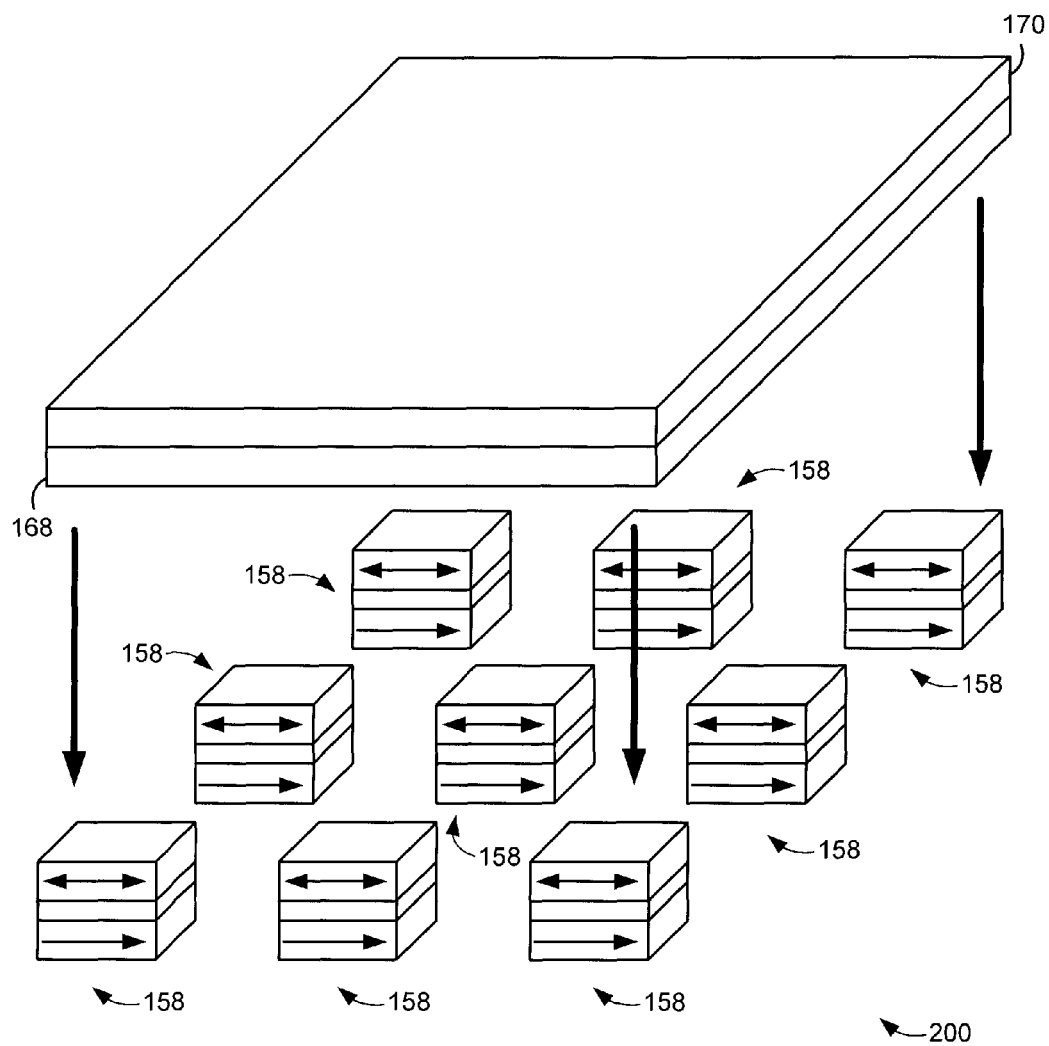
FIG. 8 shows an array of resistive sense elements configured in accordance with various embodiments of the present invention.

In FIG. 8, a memory array 200 is shown in accordance with various embodiments of the present invention. A plurality of resistive sense elements 158 are arranged in the array 200 defined by rows and columns. The repair plane 168 can be constructed to be adjacent to each resistive sense element 158 simultaneously. That is, the generation of a magnetic field by the repair plane 168 will result in each resistive sense element 158 in the array 200 being exposed to the generated field.

Figure 9:
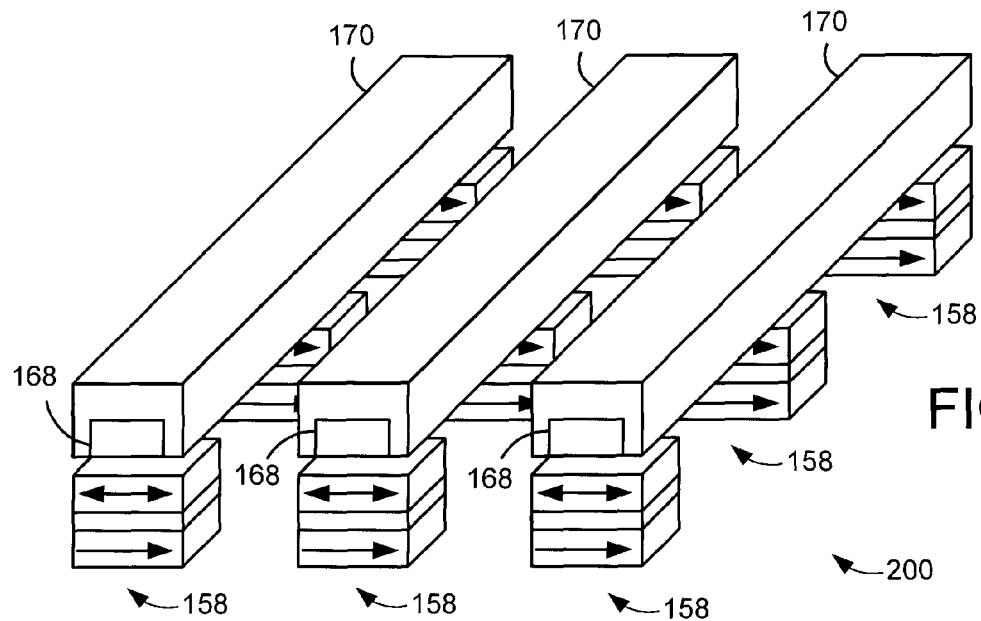
FIG. 9 illustrates an array of resistive sense elements configured in accordance with various embodiments of the present invention.

FIG. 9 illustrates an alternative memory array 200 in accordance with various embodiments of the present invention. The row and column configuration of the array 200 allows for separate repair planes 168 to be positioned adjacent to the resistive sense element 158 in each column. To reduce magnetic field interference from different repair planes 168, the enhancement layers 170 surround the respective repair planes 168 on all sides not facing the resistive sense elements 158. The configuration that includes the repair plane 168 following each row can be designated as aligning with the long axis of the resistive sense elements 158.

Figure 10:
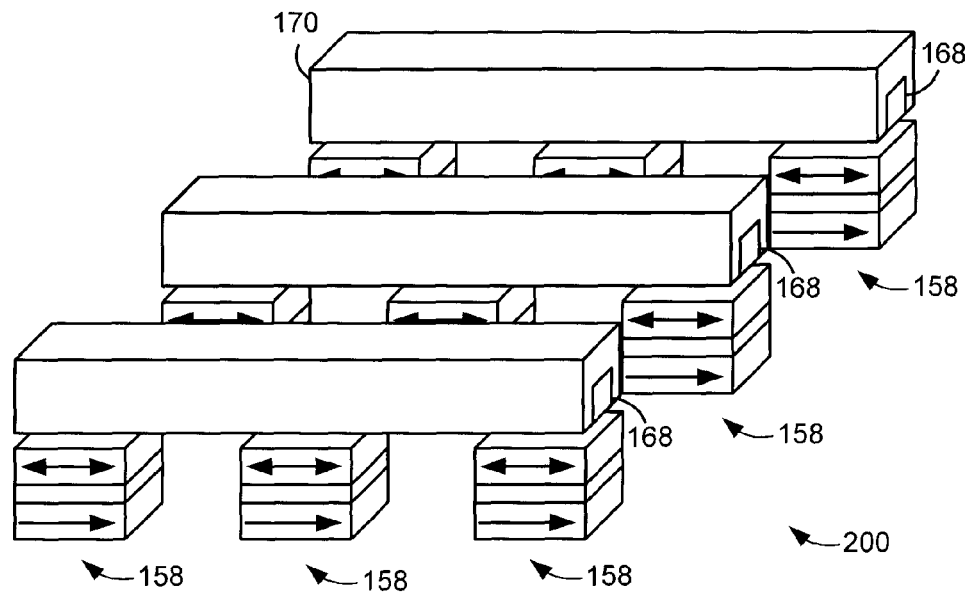
FIG. 10 provides an array of resistive sense elements configured in accordance with various embodiments of the present invention.

FIG. 10 displays yet another alternative configuration of the array 200, wherein a separate repair plane 168 is aligned along each row of elements 158. The use of multiple repair planes 168 as shown in FIGS. 9 and 10 provides enhanced control over which resistive sense elements receive repair. The placement of repair planes 168 corresponding to columns can be designated by the axis of each resistive sense element 158 that is parallel to the repair plane 168. As such, the repair plane 168 of FIG. 9 would be classified as aligned with the short axis of the resistive sense element 158.

Figure 11:
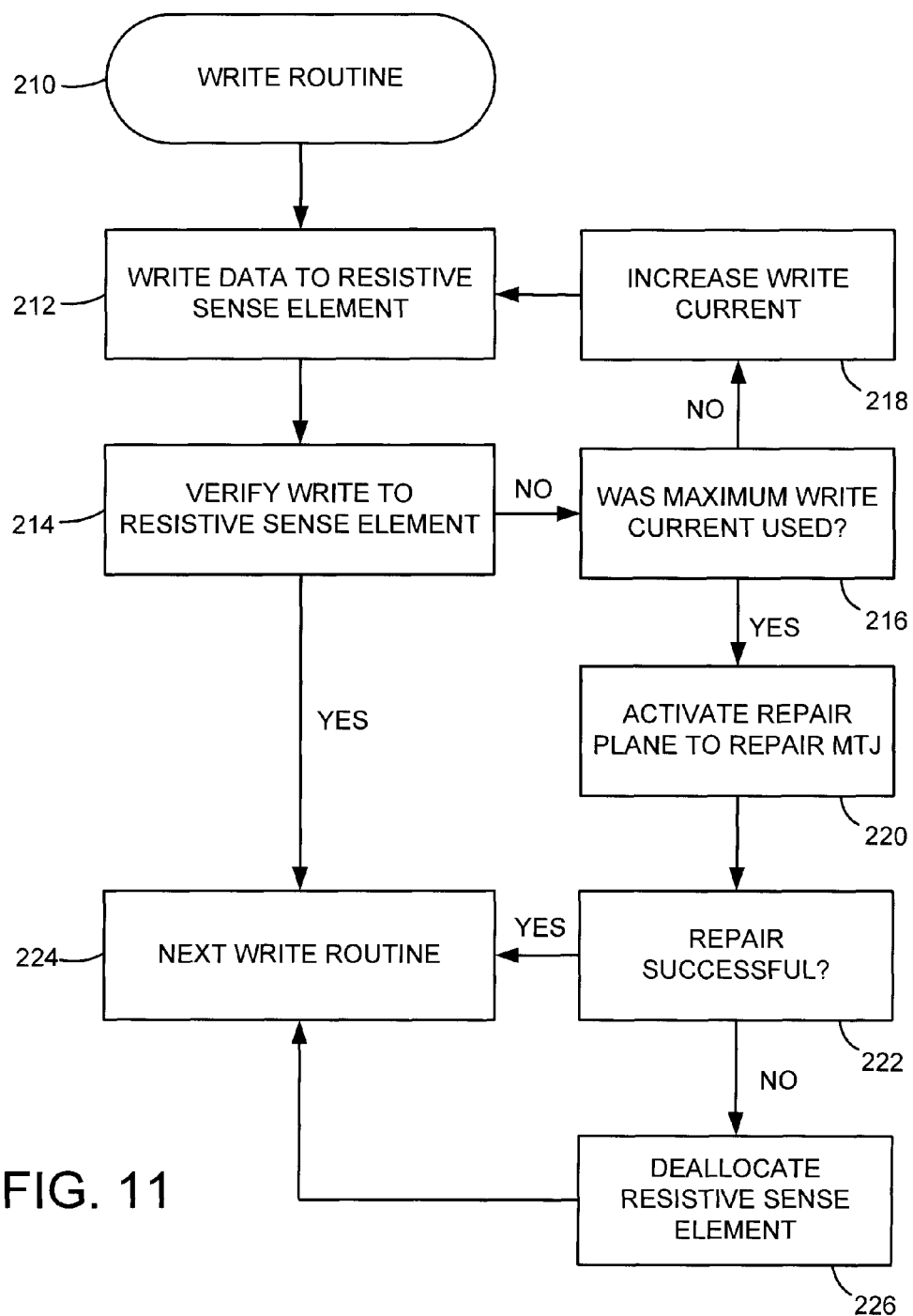
FIG. 11 shows a flow diagram for a write routine performed in accordance with various embodiments of the present invention.

FIG. 11 displays a flow diagram of a write routine 210 performed in accordance with various embodiments of the present invention. At step 212, data are written to a selected resistive sense element 158 with a predetermined write current 172 that provides a minimum amount of power in an attempt to set the resistance state of the MTJ 160. A read-verify operation is conducted at step 214 to check if the write operation of step 212 was successful in setting the logical state of the resistive sense element 158.

If the write operation of step 212 was unsuccessful, the amount of current used in the write operation is compared to a maximum threshold value at step 216. If less than a maximum threshold value was used, the write current is increased at step 218 and a new write operation is conducted on the MTJ 160 at step 212.

It can be appreciated that numerous write operations can be conducted and the write current used can be incremented several times before the maximum threshold current value is reached. Once the threshold is met at step 216, it is presumed that a stuck-at defect condition may be present in the element 158.

In such case, the repair plane adjacent the selected resistive sense element 158 is activated to repair the defective state of the MTJ 160. In some embodiments, a plurality of different current pulses are applied to the repair plane 168 at step 220 to generate a variety of magnetic fields and increase to probability of correcting the stuck-at defect condition of the MTJ 160.

Step 222 determines whether the repair operation was successful. If so, the flow passes to step 224 where the next write routine can commence. The next write routine can comprise writing data to a different resistive sense element 158, the same resistive sense element that was repaired or written, or completing all writing operations for the array 200. If the repair operation was unsuccessful, the flow passes to step 226 where other corrective action is taken, such as deallocation of the element, after which the flow passes to step 224.

Figure 12:
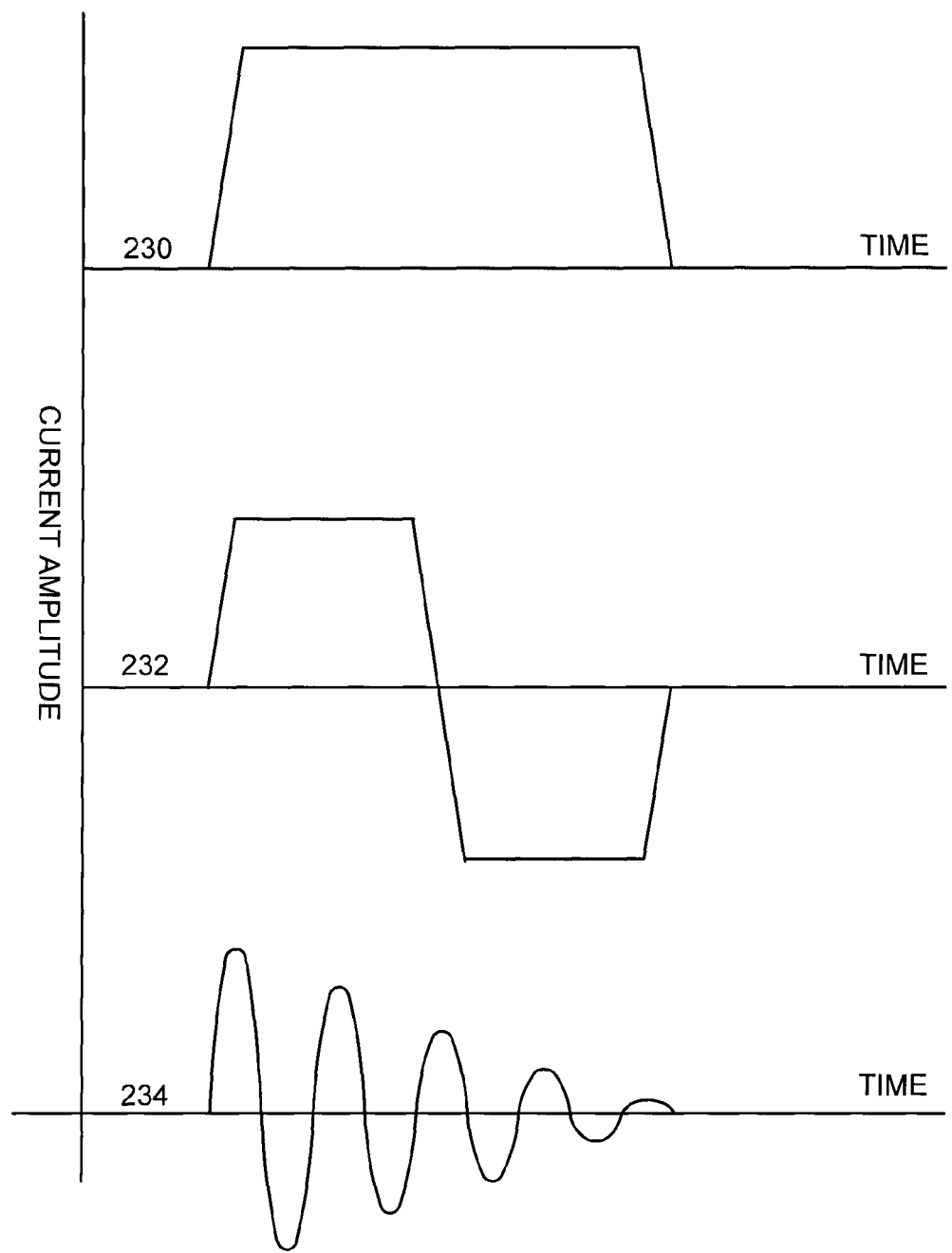
FIG. 12 illustrates current pulses performed in accordance with various embodiments of the present invention.

FIG. 12 shows various current pulses that can be applied to the repair planes 168 disclosed herein during repair operations such as at step 220 in FIG. 11. A first current pulse 230 in FIG. 12 has a constant positive value that will generate a steady-state magnetic field to potentially repair an MTJ. A second current pulse 232 has both positive and negative components selected to potentially disturb and reset the magnetization of the selected MTJ 160.

A third current pulse 234 is modeled by a damping curve that will vary the polarization of the magnetic field of the repair plane 168, such as an AC degaussing pulse. The current pulses 230, 232, and 234 can be sent to the repair plane 168 individually or in combination to provide the maximum possible opportunity to repair the stuck at defect of the selected MTJ 160.

As can be appreciated by one skilled in the art, the various embodiments illustrated herein provide advantageous writing of data to a memory cell in a fast and reliable manner. The ability to repair a defective memory cell allows for consistent data writing and reading. The use of an initially reduced write current for all write operations improves the efficiency of an array of resistive sense elements 158. Moreover, the dynamic nature of the repair operations provides increased performance of a memory device with the reduced chance of a device failure due to defective data retention. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A magnetic stack comprising:
   a resistive sense element having a magnetic tunneling junction (MTJ); and
   a repair plane spanning multiple resistive sense elements and separated from at least one MTJ by a predetermined distance that corresponds to a magnetic field generated by a current pulse conducted through the repair plane, the magnetic field influencing a magnetic free layer of the MTJ to repair a stuck-at defect condition in the MTJ.

2. The magnetic stack of claim 1, wherein the current pulse is an AC degaussing pulse that varies a polarization of the magnetic field.

3. The magnetic stack of claim 1, wherein the current pulse has a steady state positive amplitude that lasts a predetermined amount of time.

4. The magnetic stack of claim 1, wherein the current pulse alternates between positive and negative amplitudes to disturb the magnetization of a magnetic free layer of the MTJ.

5. The magnetic stack of claim 1, wherein the resistive sense elements are connected to row and column decoders while the repair plane is connected to an enhancement layer.

6. The magnetic stack of claim 1, wherein the repair plane is partially surrounded by a soft magnetic material.

7. The magnetic stack of claim 1, wherein the repair plane repairs the MTJ after a failed write verify operation.

8. The magnetic stack of claim 1, wherein the repair plane repairs the MTJ after successively increasing a write current passed through the resistive sense element to a predetermined threshold.

9. The magnetic stack of claim 1, wherein resistive sense element is spin-torque transfer random access memory (STRAM).

10. A method comprising:
    providing a resistive sense element having a magnetic tunneling junction (MTJ); and
    repairing a stuck-at defect condition in the MTJ with a magnetic field generated by passing a current pulse through a repair plane that spans multiple resistive sense elements, the repair plane separated from the MTJ by a predetermined distance that corresponds to the magnetic field influencing a magnetic free layer of the MTJ.

11. The method of claim 10, wherein the current pulse is an AC degaussing pulse that varies a polarization of the magnetic field.

12. The method of claim 10, wherein the current pulse has a steady state positive amplitude that lasts a predetermined amount of time.

13. The method of claim 10, wherein the current pulse alternates between positive and negative amplitudes to disturb a magnetization of a magnetic free layer of the MTJ.

14. The method of claim 10, wherein the repair plane is aligned with a long axis of the resistive sense element.

15. The method of claim 10, wherein the repair plane is aligned with a short axis of the resistive sense element.

16. The method of claim 10, wherein the repair plane is partially surrounded by a soft magnetic material.

17. A magnetic stack comprising:
    a plurality of resistive sense elements each having a magnetic tunneling junction (MTJ);
    a row and column decoder respectively connected to a plurality of control lines that allow access to one or more resistive sense elements; and
    a repair plane positioned a predetermined distance from the MTJ to repair a stuck-at defect condition of the MTJ in response to a current pulse generating a magnetic field that induces a magnetic free layer of the MTJ to switch magnetization directions.

18. The magnetic stack of claim 17, wherein the current pulse is an AC degaussing pulse that varies a polarization of the magnetic field.

19. The magnetic stack of claim 17, wherein the current pulse alternates between positive and negative amplitudes to switch a magnetization direction.

20. The magnetic stack of claim 1, wherein the repair plane is proximal to a magnetic free layer and distal to a magnetically fixed layer of the resistive sense element.

* * * * *